United States Patent [19]

Chung

[11] Patent Number: 5,369,055
[45] Date of Patent: Nov. 29, 1994

[54] METHOD FOR FABRICATING TITANIUM SILICIDE CONTACTS

[75] Inventor: Ji H. Chung, Sungdongku, Rep. of Korea

[73] Assignee: Hyundai Electronics Industries Co., Ltd., Kyoungkido, Rep. of Korea

[21] Appl. No.: 72,527

[22] Filed: Jun. 4, 1993

[30] Foreign Application Priority Data

Jun. 5, 1992 [KR] Rep. of Korea .................. 1992-9728

[51] Int. Cl.$^5$ .................. H01L 21/265; H01L 21/283
[52] U.S. Cl. .................. 437/200; 437/29; 437/57; 437/190; 148/DIG. 19; 148/DIG. 147
[58] Field of Search .................. 437/22, 56, 57, 58, 437/200, 29, 190, 192, 27; 148/DIG. 19, DIG. 147

[56] References Cited

U.S. PATENT DOCUMENTS

| | | | |
|---|---|---|---|
| 4,566,026 | 1/1986 | Lee et al. | 437/189 |
| 4,960,732 | 10/1990 | Dixit et al. | 437/192 |
| 5,217,923 | 6/1993 | Suguro | 437/200 |

FOREIGN PATENT DOCUMENTS

| | | | |
|---|---|---|---|
| 0085777 | 8/1983 | European Pat. Off. | 437/200 |
| 1-25410 | 1/1989 | Japan | 437/200 |

Primary Examiner—T. N. Quach
Attorney, Agent, or Firm—Darby & Darby

[57] ABSTRACT

A method for fabricating titanium silicide contacts wherein prior to a Ti sputtering process, ions having a conductivity opposite to the conductivity of source and drain regions on each well are implanted in the source and drain regions by using the same mask as used in the Ti sputtering process, so as to form low concentration regions at contact surfaces and high concentration regions at regions beneath the contact surfaces.

7 Claims, 3 Drawing Sheets

METHOD FOR FABRICATING TITANIUM SILICIDE CONTACTS

BACKGROUND OF THE INVENTION

1. Field of the Invention

The present invention relates to a method for fabricating titanium silicide contacts.

2. Description of the Prior Art

In general semiconductor fabrications for ASIC devices, the most important factor to be considered is the delay characteristic caused by resistances and capacitances, as compared with fabrications of memory devices.

Major factors affecting such a delay characteristic includes a transistor channel resistance, namely, a saturated current amount, a gate electrode capacitance, concentrations and depths of source and drain regions, a channel length, a channel width, a punchthrough characteristic, a leakage current characteristic, and a junction breakdown voltage characteristic. For realizing superior devices, complemental relationships among the above characteristics should be optimized.

In conventional MOSFET fabrications, the concentrations of source and drain regions should be optimized within a range that the punchthrough characteristic is not degraded, since they affect the effective channel length, so that they have a direct relationship with the current amount. In a device design in a range of not more than micrometers ($\mu$), the reliability of devices is considerably dependent on the overlap length between a gate electrode and source/drain regions. This is determined by the source/drain concentrations and a subsequent thermal process, as well as the spacer length.

However, the conventional methods use source and drain regions of high concentration, for an increase in current amount by an adjustment of the effective channel length. They also use $TiSi_2$ contacts, in order to reduce the contact resistance. In this case, however, the high concentration causes a phenomenon that the $TiSi_2$ contacts may be partially peeled from the source/drain regions. As a result, there are problems of a simple contact resistance increase and a degradation in reliability. These problems also result in a limitation on a technical flexibility for obtaining characteristics of devices.

SUMMARY OF THE INVENTION

Therefore, the present invention has been made in view of the above-mentioned problems and an object of the invention is thus to provide a method for fabricating titanium silicide contacts capable of realizing a high concentration source/drain structure and avoiding a peeling phenomenon upon forming $TiSi_2$ contacts, by implanting ions at a low concentration in surfaces of active regions, using existing n+ and p+ masks after opening contact holes for forming the contacts.

In accordance with the present invention, this object can be accomplished by providing a method for fabricating titanium silicide contacts on high concentration source and drain regions formed in p- and n-wells, comprising the steps of: depositing an insulating film over an entire exposed upper surface of a structure including the source and drain regions and then forming contact holes through which the source and drain regions are partially exposed; implanting, in surfaces of the exposed portions of the source and drain regions as high concentration active regions, impurity ions with a conductivity opposite to a conductivity of the source and drain regions; depositing a titanium from over each of the source and drain region portions implanted with the impurity ions of the opposite conductivity; and heat treating the titanium film, to form a titanium silicide film, and forming a metal contact on the titanium silicide film, the metal contact capable of enhancing a contact resistance and a delay characteristic.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENT

Figure 1A:
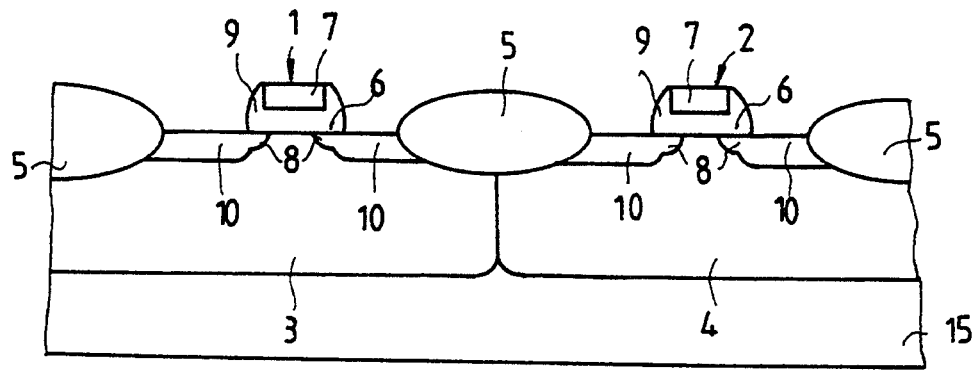
FIGS. 1B, 1C, 1D, 1E, 1F, 1G and 1H are schematic sectional views illustrating a method for fabricating a CMOS structure in accordance with the present invention.

Referring to FIGS. 1A to 1H, there is illustrated a method for fabricating a CMOS structure in accordance with the present invention. In the figures, reference numerals 1 and 2 denote a NMOS structure and a PMOS structure, respectively. Also, the reference numeral 3 denotes a p-well, 4 a n-well, 5 element isolation insulating films, 6 a gate oxide film, 7 gate electrodes, 8 LDD (lightly doped drain) ion-implanted regions, 9 spacers, 10 source and drain regions, 11 an oxide film, 12 a titanium film, 13 a TiN film, 14 an aluminum film, 15 a semiconductor substrate, and 16 a titanium silicide film.

In accordance with the method of the present invention, first, the p-well 3 and the n-well 4 are formed on the semiconductor substrate 15, using an implantation of trivalent impurities and an implantation of pentavalent impurities, respectively, as shown in FIG. 1A. Thereafter, formations of the gate oxide film 6 and the gate electrodes 7 are carried out. Ions are then implanted in surface portions of the p-well 3 and n-well 4 disposed beneath the gate electrodes 7 by using the LDD process, so as to form the LDD ion-implanted regions 8 of low concentration. Then, the gate oxide film 6 is etched to form spacers 9 surrounding gate electrodes 7. Subsequently, the source and drain regions 10 are formed by implanting n+ ions and p+ ions in surface portions of the p-well 3 and n-well 4 disposed between adjacent element isolation insulating films 5.

Figure 1B:
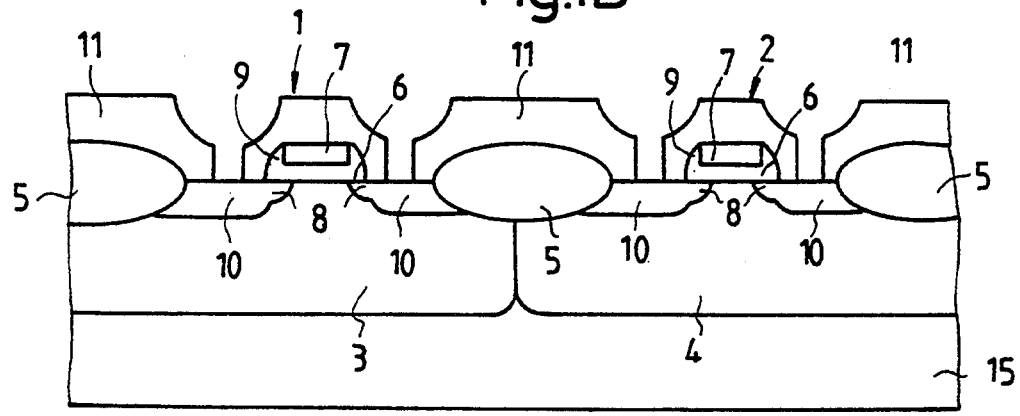

Thereafter, the source and drain regions 10 are subjected to an annealing so that the implanted n+ ions and p+ ions are diffused, as shown in FIG. 1B, Over the entire exposed upper is surface of the resultant structure, the oxide film 11 deposited, using tetrathoxysilane (TEOS) or is borophosphosilicate glass (BPSG) glass. The oxide film etched using a contact mask, so as to form contact holes over the source and drain regions 10.

Figure 1C:
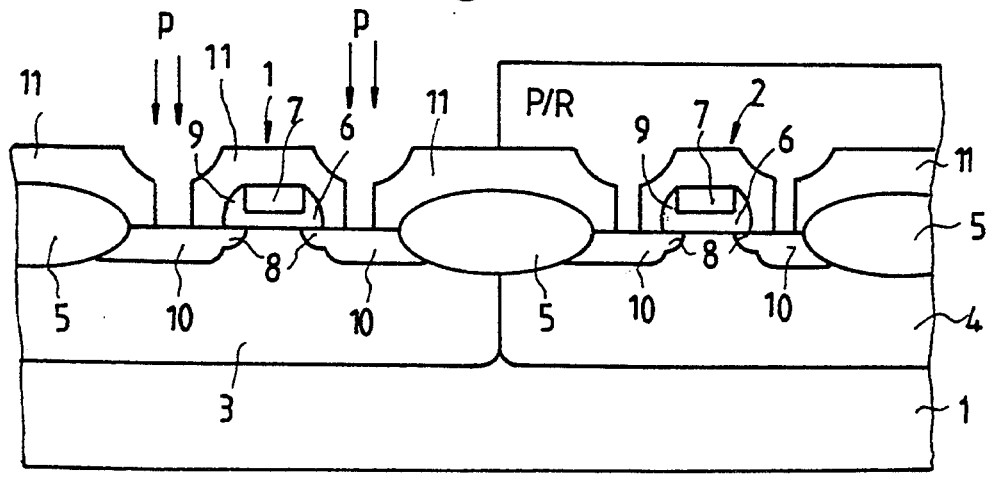

Thereafter, trivalent impurity ions having a conductivity opposite to n+ ions, that is, $BF_2$ ions are implanted in a proper amount in surface portions of the source and drain regions 10 and exposed through the contact holes, as shown in FIG. 1C. Accordingly, the surface portions of the source and drain regions 10 disposed on the p-well 3 have a conductivity of low concentration n type converted from the high concentration n type (n+).

Figure 1D:
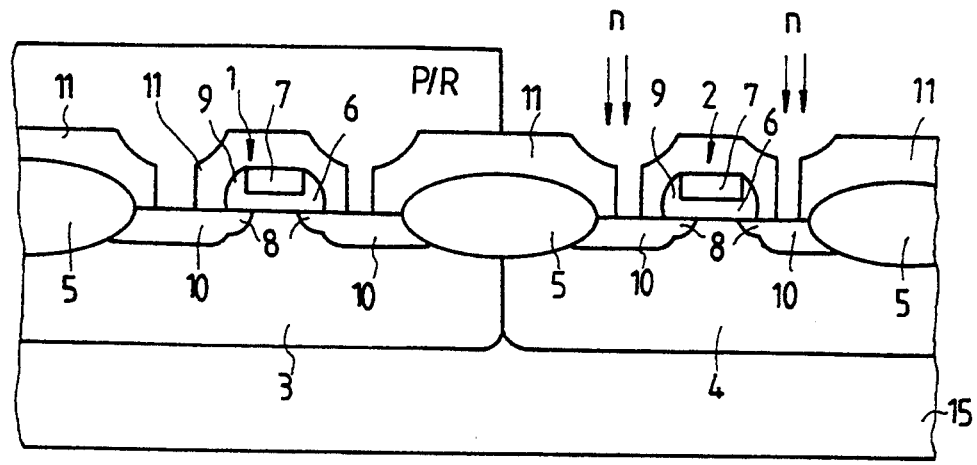

In similar, pentavalent impurity ions having a conductivity opposite to n+ ions, that is, As ions are implanted in a proper amount in surface portions of the source and drain regions 10 and exposed through the contact holes, as shown in FIG. 1D. Accordingly, the surface portions of the source and drain regions 10 disposed on the n-well 4 have a conductivity of low concentration p type converted from the high concentration p type (p+).

Figure 1E:
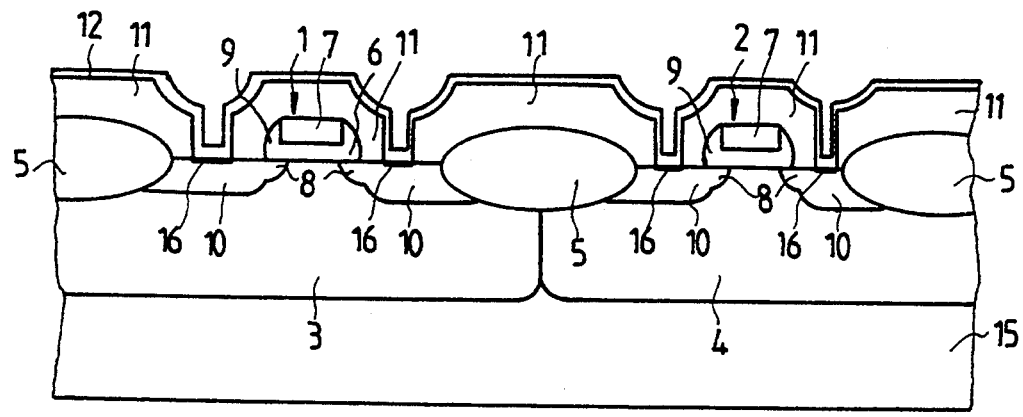

Concentrations and implantation energies of the impurity ions, that is, BF$_2$ ions and As ions implanted for making the surface portions of source and drain regions 10 have the low conductivity should be determined, taking into consideration the concentrations and depths of the already formed source and drain regions 10 and a predicted thickness of the TiSi$_2$ film to be subsequently formed, Then, the source and drain regions 10 is subjected to implantation of impurity ions having conductivities opposite to those of the source and drain regions 10, as shown in FIG. 1E. Over the entire exposed upper surface of the resultant structure, a titanium film 12 is then deposited to a thickness of about 300 to 800 Å, using the sputtering method. Subsequently, a first surface treatment for forming the titanium silicide film 16 is performed at 600° to 900° C.

Figure 1F:
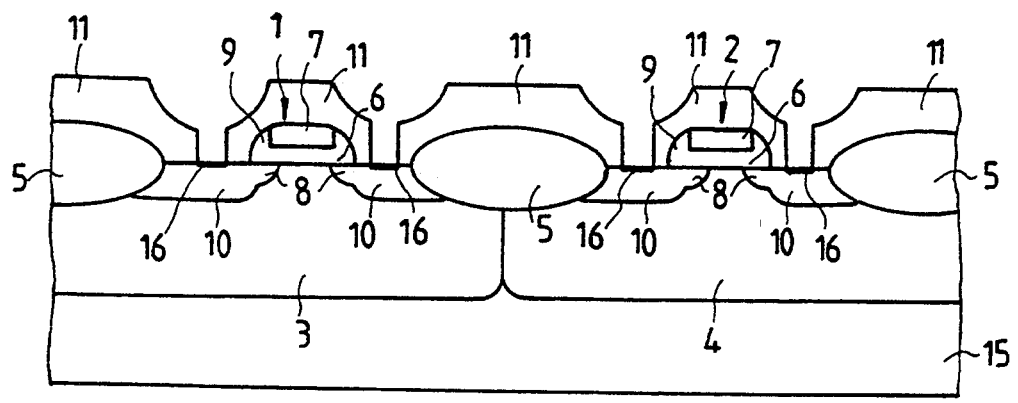

The titanium film 12 disposed over the titanium silicide film 16 is then removed, as shown in FIG. 1F. Under this condition, a second surface treatment is carried out.

In two surface treatments mentioned above, activations and diffusions of BF$_2$ and As are simultaneously carried out. Accordingly, a rapid thermal annealing process should be used, so as to maintain depths of BF$_2$ and As layers to be small. In the case of NMOS structure 1, particularly, surface treatment temperature and time should be optimized, since the diffusion rate of boron ions is high. At the surface treatment time of 20 to 30 seconds, the ions are diffused toward the channel in the source and drain regions 10 previously formed.

Figure 1G:
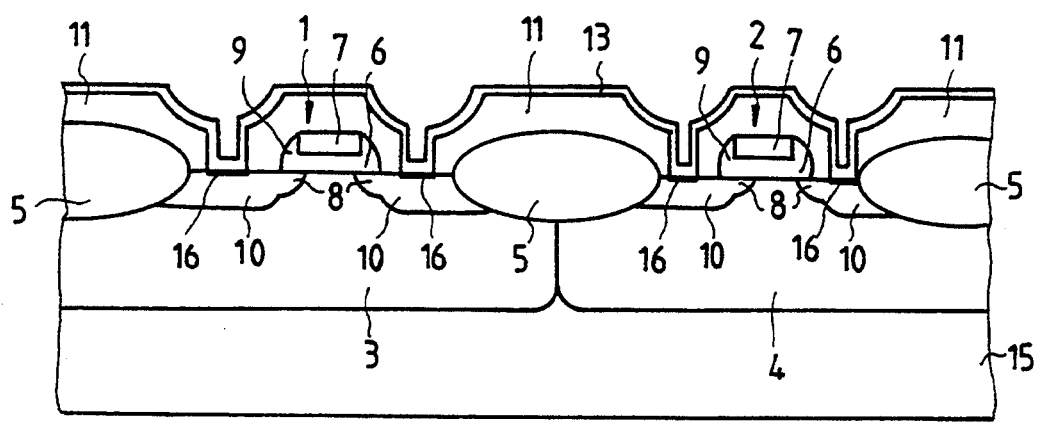

Over the entire exposed upper surface of the resultant structure after the surface treatments, a TiN film 13 as an etch barrier layer is deposited to the thickness of about 500 to about 900 Å, as shown in FIG. 1G.

Figure 1H:
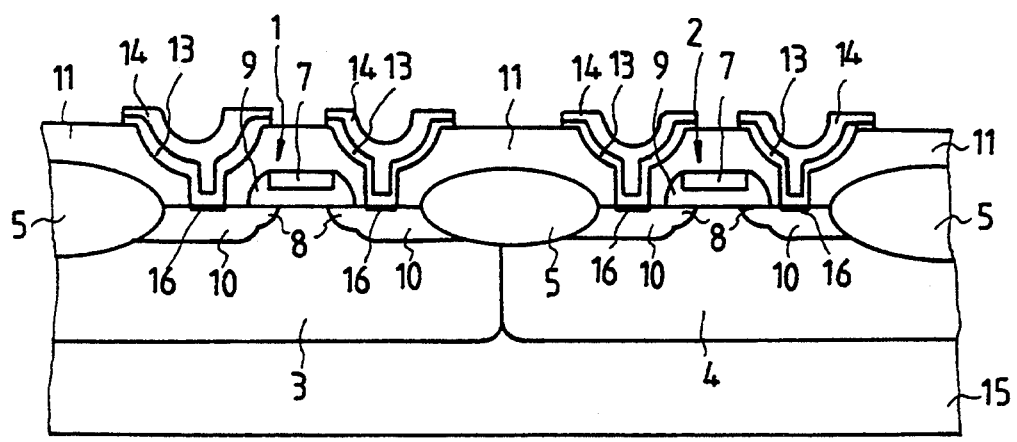

Finally, an aluminum film 14 is deposited over the TiN film 13 by using the sputtering method and then patterned to form metal contacts, as shown in FIG. 1H.

As apparent from the above description, the present invention provides a method for fabricating titanium silicide contacts wherein prior to the Ti sputtering process, ions having a conductivity opposite to the conductivity of source and drain regions on each well are implanted in the source and drain regions by using the same mask as used in the Ti sputtering process, so as to form low concentration regions at contact surfaces and high concentration regions at regions beneath the contact surfaces. As a result, it is possible to solve problems of an increase in contact resistance as a technical limitation factor in the prior art, a decrease in current amount caused by an adjustment of effective channel length, a difficulty to adjust an overlap length between each of source and drain regions and each of gates, and a phenomenon that the TiSi$_2$ film is peeled from the high concentration source and drain regions.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating titanium silicide contacts on high concentration source and drain regions, comprising the steps:

depositing an insulating film over an entire exposed upper surface of a structure including the source and drain regions and then forming contact holes through which the source and drain regions are partially exposed;

implanting, in surfaces of the exposed portions of the source and drain regions as high concentration active regions, impurity ions with a conductivity opposite to a conductivity of the source and drain regions, the impurity with the opposite conductivity implanted in the source and drain regions is BF$_2$;

depositing a titanium film over each of the source and drain region portions implanted with the impurity ions of the opposite conductivity; and heat treating the titanium film, to form a titanium silicide film, and forming a metal contact on the titanium silicide film, the metal contact capable of enhancing a contact resistance and a delay characteristic.

2. A method in accordance with claim 1, wherein the step of heat treating the titanium film comprises the steps of primarily heat treating the titanium film, to form the titanium silicide film, etching the titanium film, to remove it, and secondarily heat treating each portion of the source and drain regions over which the titanium silicide film is disposed.

3. A method in accordance with claim 2, wherein a heat treatment temperature at the step of secondarily heat treating each portion of the source and drain regions is in a range of 800° to 900° C.

4. A method in accordance with claim 1, wherein the step of forming the metal contact on the titanium silicide film comprises the steps of depositing, over the titanium silicide film, a film of TiN as an etch barrier material , and depositing a metal layer over the TiN film.

5. A method in accordance with claim 3, wherein the TiN film has a thickness of 500 to 900 Å.

6. A method in accordance with claim 1, wherein a heat treatment temperature at the step of heat treating the titanium film is in a range of 600° to 800° C.

7. A method in accordance with claim I , wherein the titanium film has a thickness of 300 to 800 Å.

* * * * *